United States Patent
Takao

(10) Patent No.: US 7,592,241 B2
(45) Date of Patent: Sep. 22, 2009

(54) SEMICONDUCTOR DEVICE HAVING WELL WITH PEAK IMPURITY CONCENTRATIONS AND METHOD FOR FABRICATING THE SAME

(75) Inventor: Yoshihiro Takao, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 220 days.

(21) Appl. No.: 11/017,859

(22) Filed: Dec. 22, 2004

(65) Prior Publication Data

US 2006/0071278 A1    Apr. 6, 2006

(30) Foreign Application Priority Data

Sep. 27, 2004    (JP) .............................. 2004-278870

(51) Int. Cl.
*H01L 21/457* (2006.01)
(52) U.S. Cl. ................... 438/514; 438/527; 438/549; 257/402; 257/497; 257/E21.443
(58) Field of Classification Search ............... 257/264, 257/348, 402–407, 335, E21.633, E21.443, 257/497; 438/231–232, 217, 224, 514, 543, 438/549, 527, 519, 545
See application file for complete search history.

(56) References Cited

U.S. PATENT DOCUMENTS

| | | | | |
|---|---|---|---|---|
| 5,786,620 A | * | 7/1998 | Richards et al. | ............ 257/408 |
| 6,064,595 A | * | 5/2000 | Logie et al. | ........... 365/185.18 |
| 6,091,116 A | * | 7/2000 | Kim et al. | ................... 257/371 |
| 6,249,025 B1 | * | 6/2001 | Tyagi | ......................... 257/344 |
| 6,492,665 B1 | * | 12/2002 | Akamatsu et al. | ........... 257/192 |
| 6,548,842 B1 | * | 4/2003 | Bulucea et al. | ............. 257/288 |
| 6,677,208 B2 | * | 1/2004 | Mehrotra et al. | ........... 438/289 |
| 7,042,051 B2 | * | 5/2006 | Ootsuka et al. | ............. 257/345 |
| 2005/0156236 A1 | * | 7/2005 | Nandakumar et al. | ....... 257/344 |

FOREIGN PATENT DOCUMENTS

| | | |
|---|---|---|
| JP | 10-74941 | 3/1998 |
| JP | 11-354785 | 12/1999 |

OTHER PUBLICATIONS

M. Togo et al., "Power-aware 65 nm node CMOS technology using variable Vdd and back-bias control with reliability consideration for back-bias mode", 2004 Symposium on VLSI Technology Digest of Technical Papers, pp. 88-89, 2004.

* cited by examiner

*Primary Examiner*—Davienne Monbleau
*Assistant Examiner*—Hoa B Trinh
(74) *Attorney, Agent, or Firm*—Westerman, Hattori, Daniels & Adrian, LLP.

(57) ABSTRACT

The semiconductor device comprises a well 58 formed in a semiconductor substrate 10 and having a channel region; a gate electrode 34n formed over the channel region with an insulating film 32 interposed therebetween; source/drain regions 60 formed in the well 58 on both sides of the gate electrode 34n, sandwiching the channel region; and a pocket region 40 formed between the source/drain region and the channel region. The well 58 has a first peak of an impurity concentration at a depth deeper than the pocket region 40 and shallower than the bottom of the source/drain regions 60, and a second peak of the impurity concentration at a depth near the bottom of the source/drain regions 60.

16 Claims, 13 Drawing Sheets

SEMICONDUCTOR DEVICE HAVING WELL WITH PEAK IMPURITY CONCENTRATIONS AND METHOD FOR FABRICATING THE SAME

CROSS-REFERENCE TO RELATED APPLICATIONS

This application is based upon and claims the benefit of priority from the prior Japanese Patent Application No. 2004-278870, filed on Sep. 27, 2004, the entire contents of which are incorporated herein by reference.

BACKGROUND OF THE INVENTION

The present invention relates to a semiconductor device and a method for fabricating the same, more specifically, a semiconductor device including MIS transistor in which the threshold voltage is controlled by a substrate bias, and a method for fabricating the semiconductor device.

As semiconductor device is more downsized and higher integrated, MIS transistor is required to be more speedy and have lower operation voltages.

For higher speed of a MIS transistor, it is effective to constitute the MIS transistor to have a low threshold voltage and make a drive voltage to be applied to the drain higher. That is, the drive force of the MIS transistor depends on a voltage difference between the drive voltage to be applied to the drain and a threshold voltage thereof, and as the voltage difference is larger, the operation speed can be higher.

On the other hand, when the threshold voltage of the MIS transistor is decreased, the off-current, i.e., the leakage current at the off state is increased. Accordingly, to decrease the leakage current, it is necessary to make the threshold voltage high to some extent.

To satisfy such requirements, which are incompatible with each other, conventionally in semiconductor devices, substrate bias is applied to thereby change the threshold voltage. The substrate bias is a voltage to be applied to a well where the MIS transistor is formed and is a voltage of the polarity opposite to that of a voltage to be applied to the gate electrode. A voltage of the polarity opposite to a voltage to be applied to the gate electrode is applied to the channel region via the well, whereby the inversion voltage of the channel is increased. Accordingly, the substrate bias is controlled, whereby the threshold voltage can be changed.

When the MIS transistor operates, no substrate bias or a substrate bias of low voltage is applied to thereby make the threshold voltage low while driving the MIS transistor at high drive voltage. Thus, the voltage difference between the drive voltage and the threshold voltage can be made large, and the high speed operation can be made possible. When the MIS transistor is not operated, a substrate bias of high voltage is applied to thereby make the threshold voltage high, and the leakage current can be decreased.

The related arts are disclosed in, e.g., Reference 1 (Japanese published unexamined patent application No. Hei 10-074941), Reference 2 (Japanese published unexamined patent application No. Hei 11-354785), and Reference 3 (M. Togo et al., "Power-aware 65 nm Node CMOS Technology Using Variable VDD and Back-bias Control with Reliability Consideration for Back-bias Mode", 2004 Symposium on VLSI Technology Digest of Technical Papers, pp. 88-89).

SUMMARY OF THE INVENTION

It has been found that as the MIS transistor is increasingly downsized, the substrate bias dependency of the threshold voltage is decreased. Especially in much downsized MIS transistors whose gate length is below, e.g., 60 nm, it is difficult to control the threshold voltage by the substrate bias.

An object of the present invention is to provide a semiconductor device of high performance which permits even a downsized MIS transistor to control the threshold voltage by the substrate bias, and a method for fabricating the semiconductor device.

According to one aspect of the present invention, there is provided a semiconductor device comprising: a well of a first conductivity type formed in a semiconductor substrate and having a channel region; a gate electrode formed over the channel region with an insulating film interposed therebetween; source/drain regions of a second conductivity type formed in the well on both sides of the gate electrode, sandwiching the channel region; and a pocket region of the first conductivity type formed between at least one of the source/drain regions and the channel region, the well having a first peak of an impurity concentration at a depth deeper than the pocket region and shallower than the bottom of the source/drain regions, and a second peak of the impurity concentration at a depth near the bottom of the source/drain regions.

According to another aspect of the present invention, there is provided a semiconductor device including a logic unit and a memory unit, comprising: a well of a first conductivity type formed in a semiconductor substrate of the logic unit and having a channel region; and a logic transistor including a gate electrode formed over the channel region with an insulating film interposed therebetween, source/drain regions of a second conductivity type formed in the well on both sides of the gate electrode, sandwiching the channel region, and a pocket region of the first conductivity type formed between at least one of the source/drain regions and the channel region, the well having a first peak of an impurity concentration at a depth deeper than the pocket region and shallower than the bottom of the source/drain regions, and a second peak of the impurity concentration at a depth near the bottom of the source/drain regions.

According to further another aspect of the present invention, there is provided a semiconductor device including a low-voltage transistor region and a high-voltage transistor region, comprising: a well of a first conductivity type formed in a semiconductor substrate of the low-voltage transistor region and having a channel region; and a low-voltage transistor including a gate electrode formed over the channel region with an insulating film interposed therebetween, source/drain regions of a second conductivity type formed in the well on both sides of the gate electrode, sandwiching the channel region, and a pocket region of the first conductivity type formed between at least one of the source/drain regions and the channel region, the well having a first peak of an impurity concentration at a depth deeper than the pocket region and shallower than the bottom of the source/drain regions, and a second peak of the impurity concentration at a depth near the bottom of the source/drain regions.

According to another aspect of the present invention, there is provided a method for fabricating a semiconductor device, including a well of a first conductivity type formed in a semiconductor substrate and having a channel region, a gate electrode formed over the channel region with an insulating film interposed therebetween, source/drain regions of a second conductivity type formed in the well on both sides of the gate electrode, sandwiching the channel region, and a pocket region of the first conductivity type formed between at least one of the source/drain regions and the channel region, the step of forming the well comprising the steps of: forming a first impurity diffused region having a first peak of an impurity concentration at a depth deeper than the pocket region and shallower than the bottom of the source/drain regions; and forming a second impurity diffused region having a second peak of the impurity concentration at a depth near the bottom of the source/drain regions.

According to the present invention, the well including the impurity diffused region having a peak of an impurity concentration near the bottom of the source/drain regions, whereby the extension of the depletion layers from the source junction and the drain junction to the channel region can be suppressed. Accordingly, even in a transistor having a shorter channel, the gate charge quantity can be increased with increase of the substrate bias, and the threshold voltage can be controlled by the substrate bias.

The well including an impurity diffused region having a peak of an impurity concentration in a region deeper than the pocket region, and the threshold voltage of the transistor is controlled by this impurity diffused region, whereby the impurity concentration near the surface side of the channel region can be decreased in comparison with the case that the impurity diffused region for the threshold voltage control is formed in region shallower than the pocket region. Accordingly, the carrier scattering by the dopant ions is decreased, and the carrier mobility can be increased.

DETAILED DESCRIPTION OF THE INVENTION

The semiconductor device and the method for fabricating the same according to one embodiment of the present invention will be explained with reference to FIGS. 1 to 12B.

Figure 1:
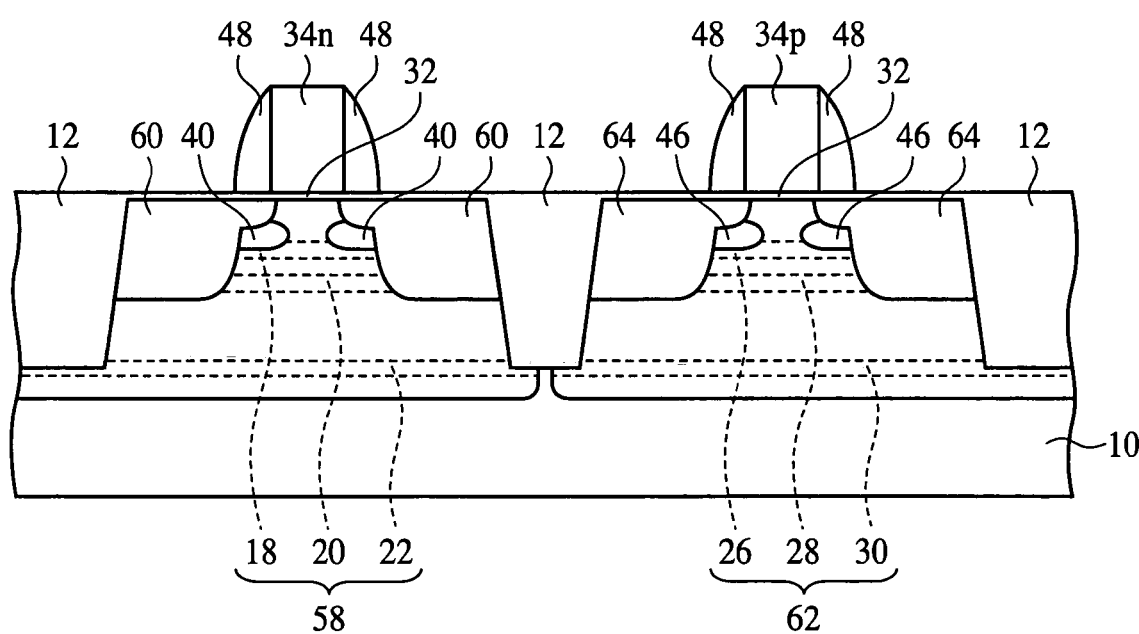
FIG. 1 is a diagrammatic sectional view of the semiconductor device according to one embodiment of the present invention, which shows a structure thereof.
Figure 2:
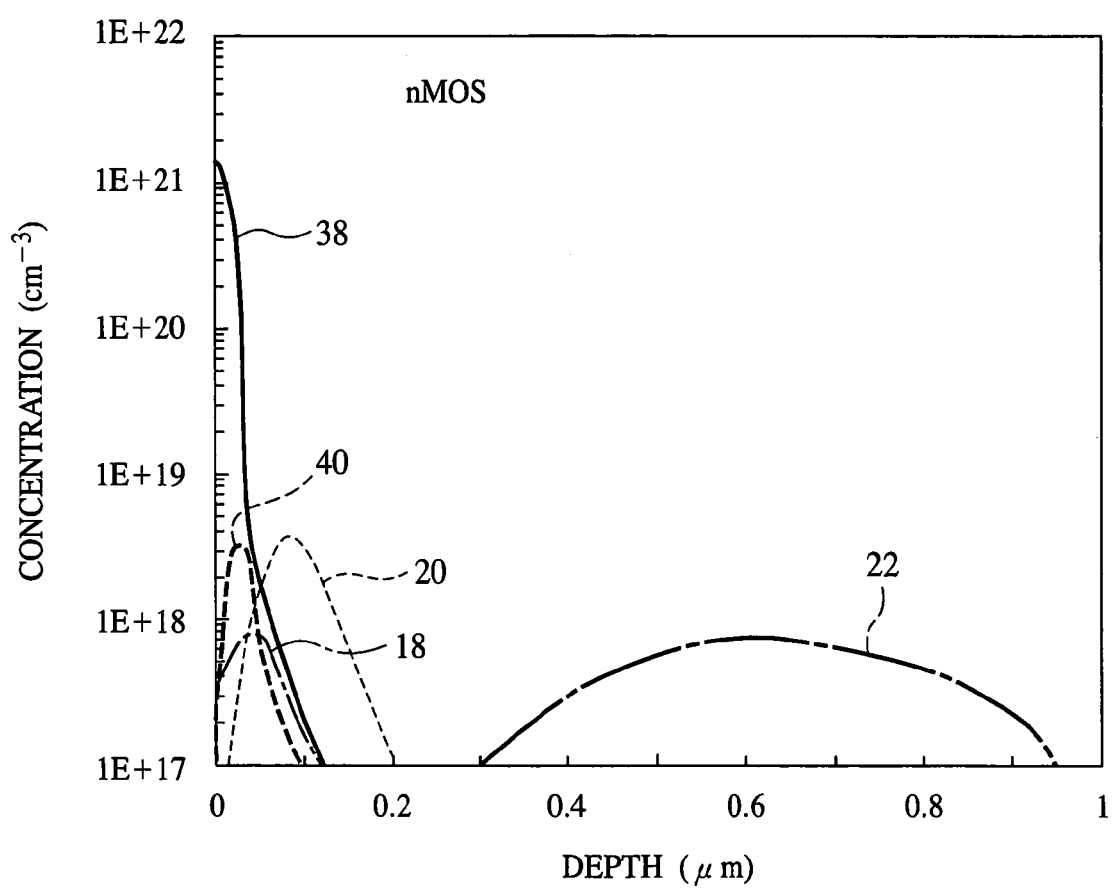
FIGS. 2 and 3 are graphs of the impurity concentration distribution in the silicon substrate of the semiconductor device according to the embodiment of the present invention.
Figure 3:
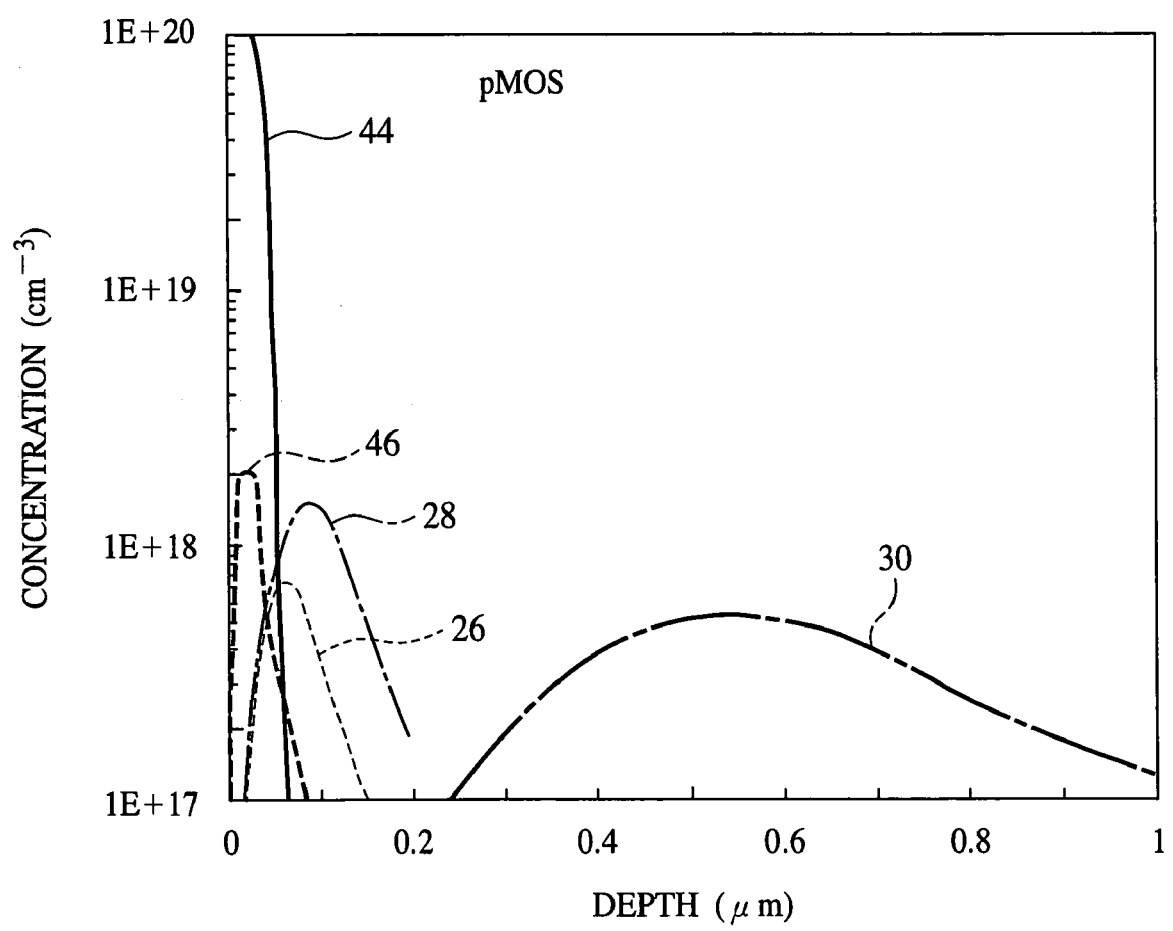

FIG. 1 is a diagrammatic sectional view of the semiconductor device according to the present embodiment, which shows a structure thereof. FIGS. 2 and 3 are graphs of impurity concentration distributions in the silicon substrate of the semiconductor device according to the present embodiment.

Figure 4:
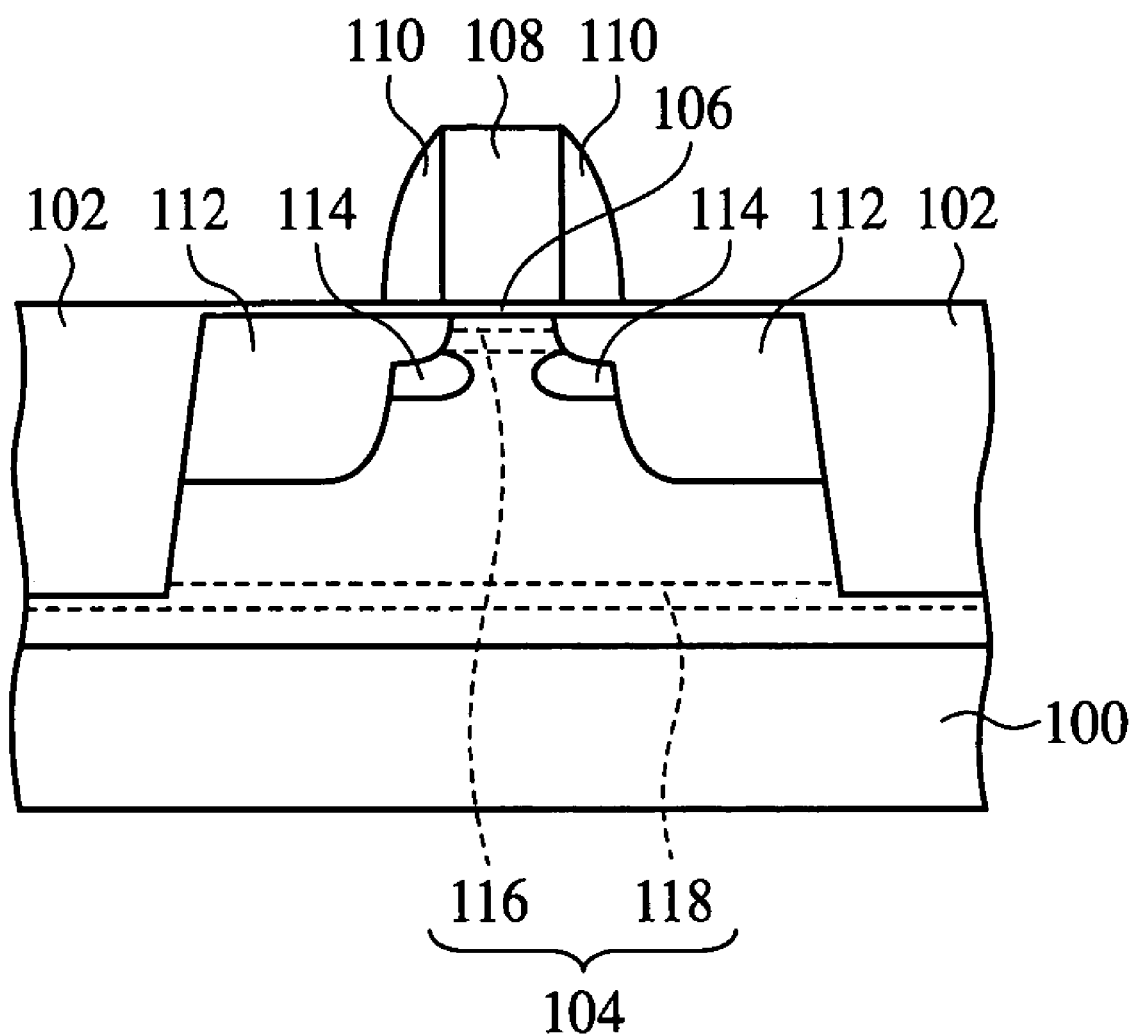
FIG. 4 is a diagrammatic sectional view of the general semiconductor device, which shows the structure thereof.
Figure 5A:
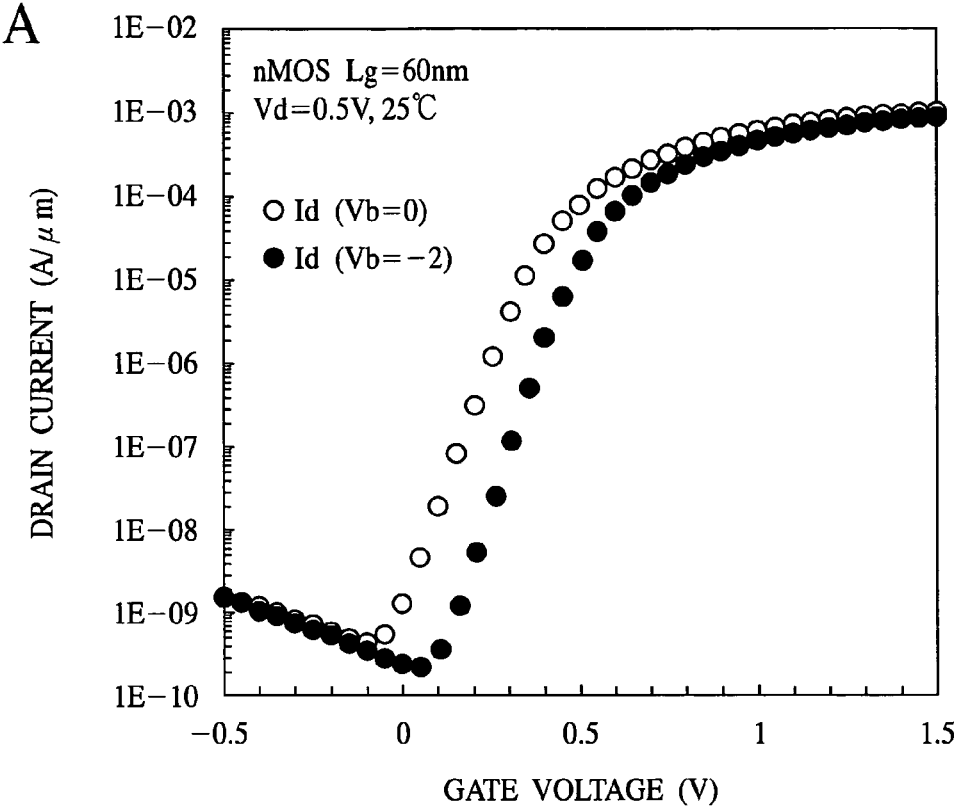
FIGS. 5A and 5B are graphs of the substrate bias dependency of the $I_d$-$V_g$ characteristics of the semiconductor device shown in FIG. 4.
Figure 5B:
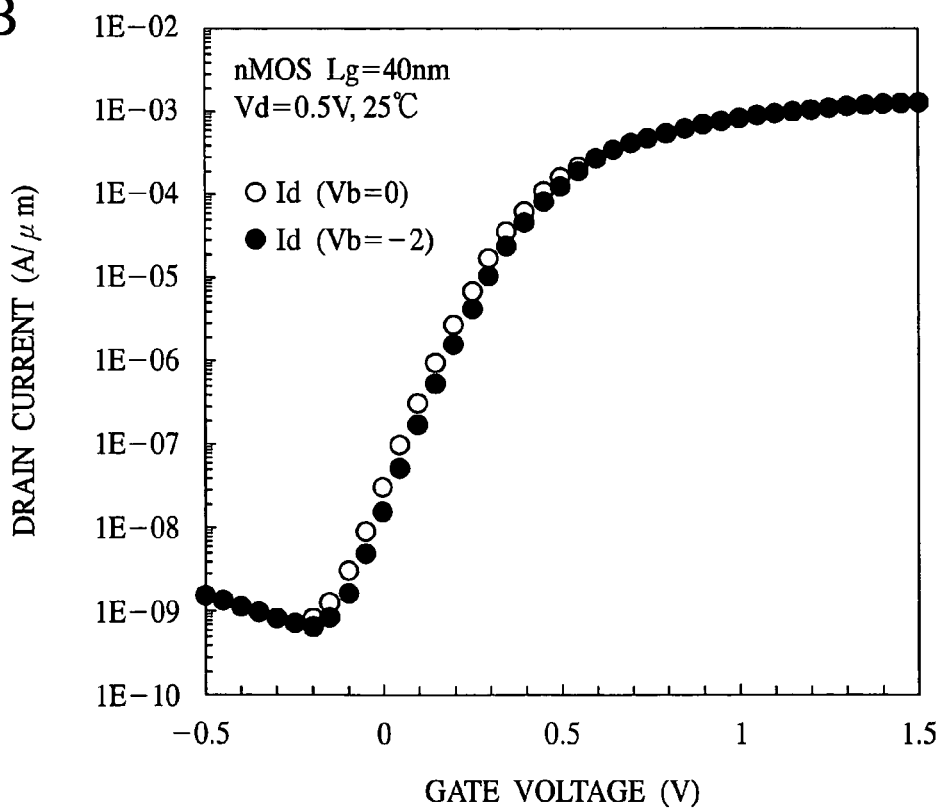
Figure 6A:
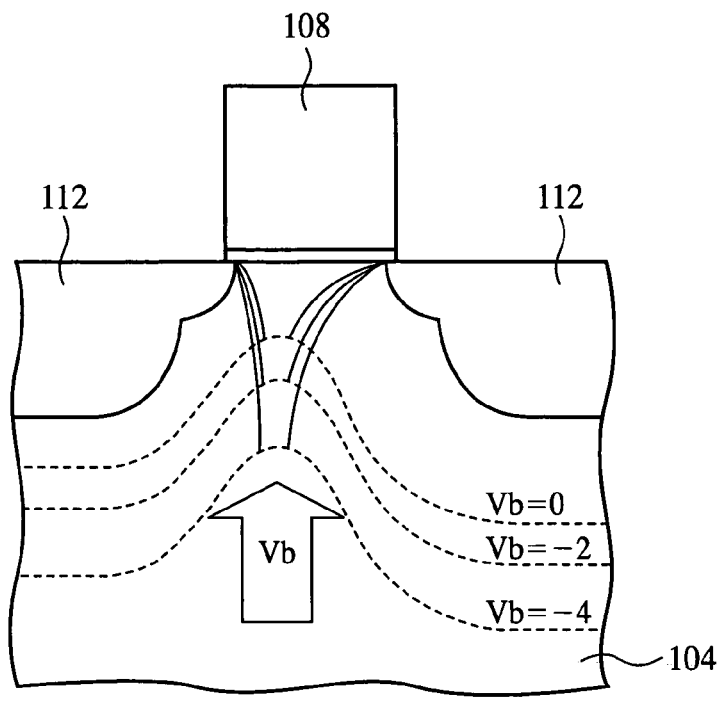
FIGS. 6A and 6B are diagrammatic views of the positions of the ends of the depletion layers and the ranges of the ends of electric flux lines from the gate electrode in the semiconductor device shown in FIG. 4.
Figure 6B:
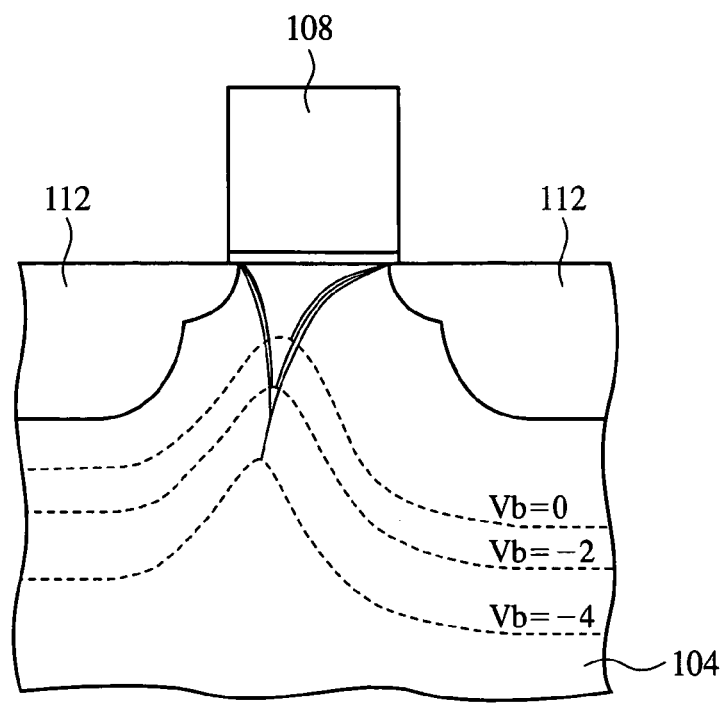
Figure 7:
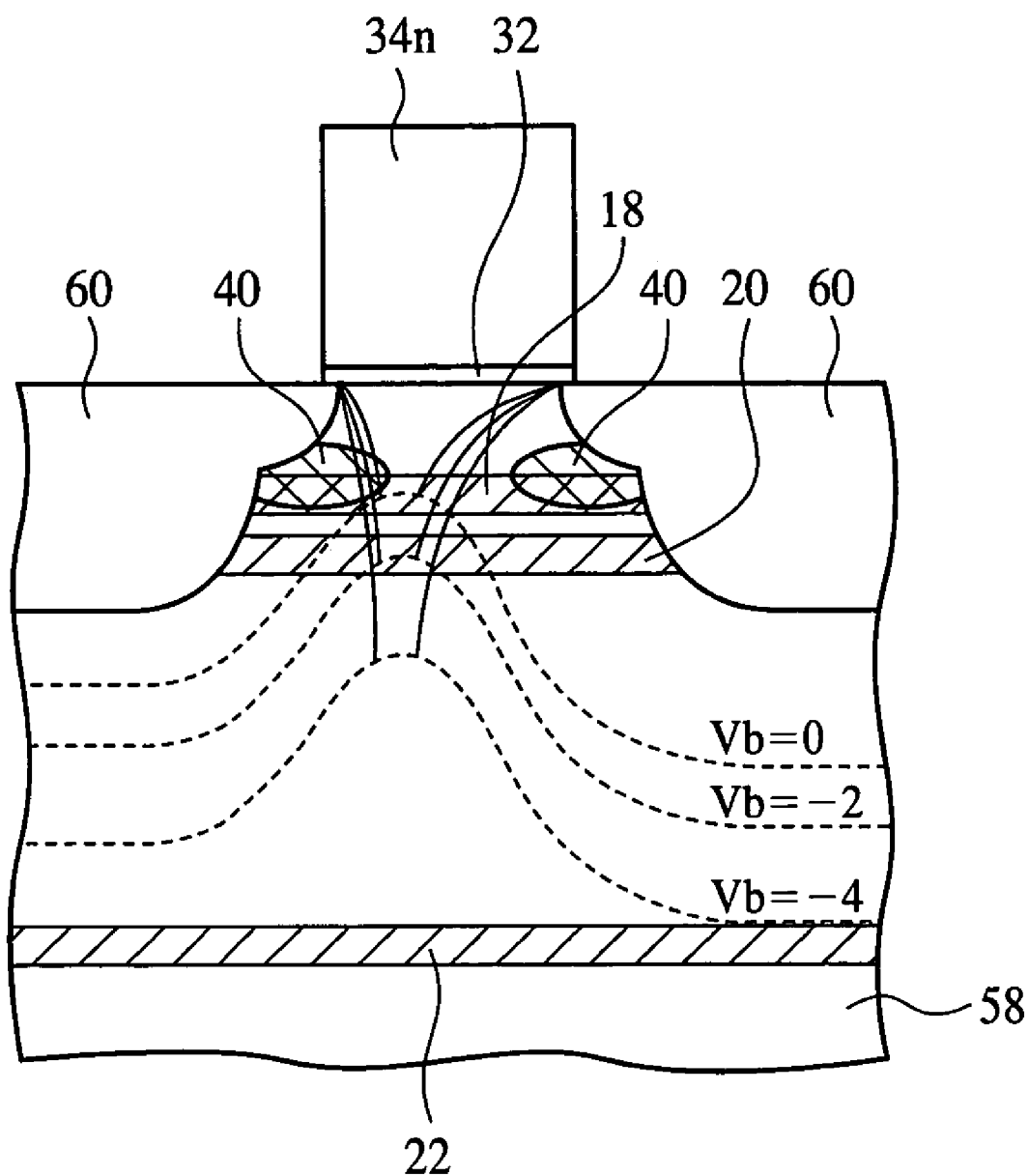
FIG. 7 is a diagrammatic view of the positions of the ends of the depletion layers and the ranges of the ends of electric flux lines from the gate electrode in the semiconductor device according to the embodiment of the present invention.
Figure 8A:
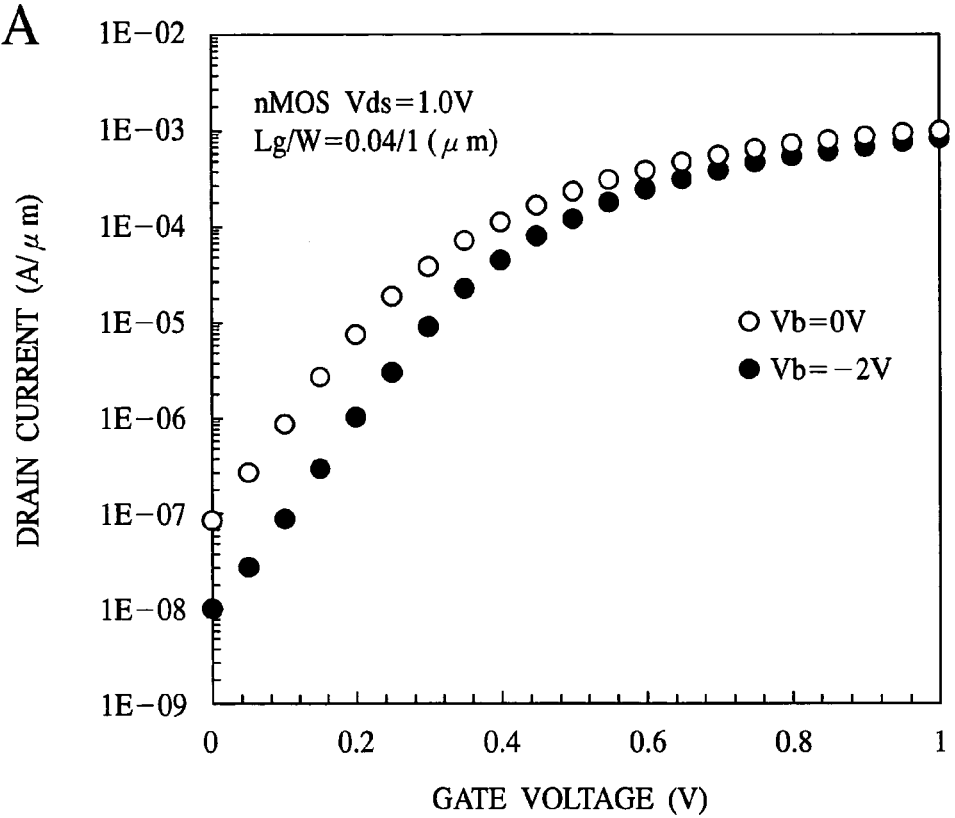
FIGS. 8A and 8B are graphs of the substrate bias dependency of the $I_d$-$V_g$ characteristics of the semiconductor device according to the embodiment of the present invention.
Figure 8B:
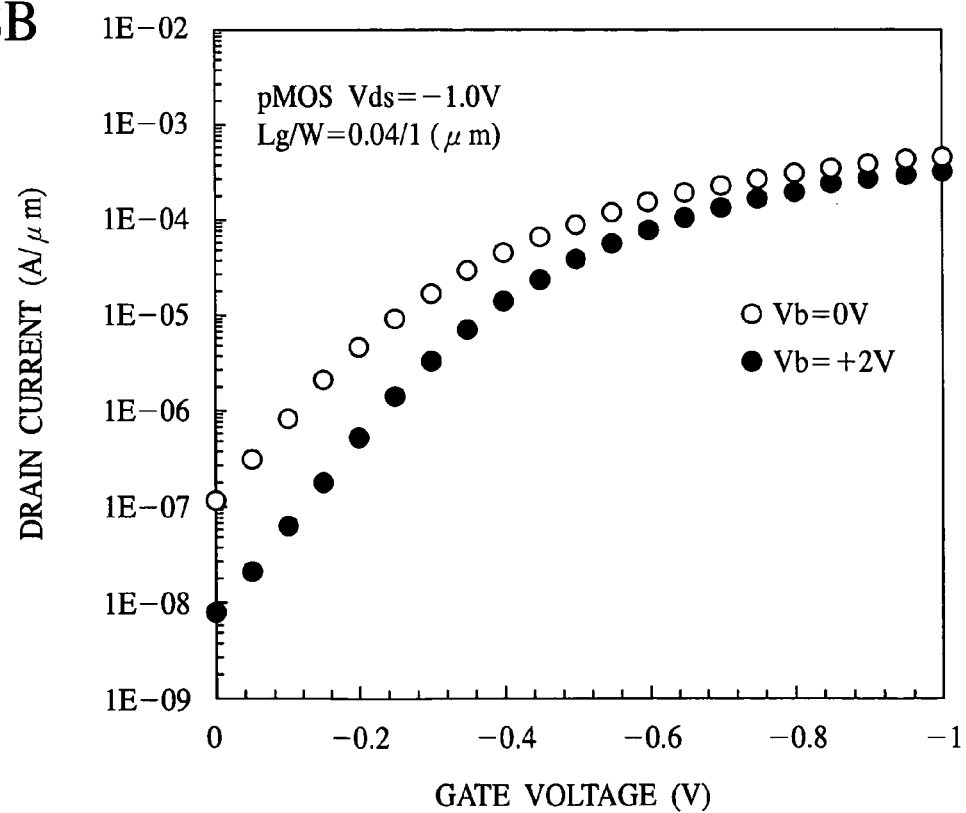

FIG. 4 is a diagrammatic sectional view of a general semiconductor device, which shows the structure thereof. FIGS. 5A and 5B are graphs of substrate bias dependency of the $I_d$-$V_g$ characteristics of the semiconductor device shown in FIG. 4. FIGS. 6A and 6B are diagrammatic views of the positions of the ends of the depletion layers and the range of the ends of the electric flux lines from the gate electrode in the semiconductor device shown in FIG. 4. FIG. 7 is a diagrammatic view of the positions of the ends of the depletion layers and the range of the ends of the electric flux lines from the gate electrode in the semiconductor device according to the present embodiment. FIGS. 8A and 8B are graphs of the substrate bias dependency of the $I_d$-$V_g$ characteristics of the semiconductor device according to the present embodiment. FIGS. 9A to 12B are sectional views of the semiconductor device according to the present embodiment in the steps of the method for fabricating the same, which show the method.

First, the structure of the semiconductor device according to the present embodiment will be explained with reference to FIGS. 1 to 3.

A device isolation film 12 is formed in the primary surface of a silicon substrate 10. The device region on the left side as viewed in the drawing is a region for an n-channel transistor, and the device region on the right side as viewed in the drawing is a region for a p-channel transistor. A p-well 58 is formed in the silicon substrate 10 in the n-channel transistor region. An n-well 62 is formed in the silicon substrate 10 in the p-channel transistor region.

A gate electrode 34n is formed on the silicon substrate 10 with a gate insulating film 32 interposed therebetween in the n-channel transistor region where the p-well 58 is formed in. A sidewall insulating film 48 is formed on the side walls of the gate electrode 34n. In the silicon substrate 10 on both sides of the gate electrode 34n, n-type source/drain regions 60 having the extension source/drain structure are formed. P-type pocket regions 40 are formed immediately below the extension regions of the n-type source/drain regions 60. The extension regions are the shallow regions of the n-type source/drain regions 60 immediately below the sidewall insulating film 48 and correspond to the n-type impurity diffused regions 38 which will be described later.

As shown in FIGS. 1 and 2, the p-well 58 includes a p-type impurity diffused region 18 having the impurity concentration peak immediately below the p-type pocket regions 40, a p-type impurity diffused region 20 having the impurity concentration peak near the bottom of the n-type source/drain diffused layer 60 and a p-type impurity diffused region 22 having the impurity concentration peak near the bottom of the device isolation film 12. The p-type impurity diffused region 18 is a diffused layer mainly for the threshold voltage control. The p-type impurity diffused region 20 is a diffused layer mainly for controlling the extension of the depletion layers from the source/drain regions 60 in the channel direction and to this end, has a higher impurity concentration than the p-type impurity diffused region 18. The p-type impurity diffused region 22 is a diffused layer mainly for constituting the well and also functions to prevent punch-through and decrease the well resistance. The p-type impurity diffused region 22 is extended entirely in the device isolation region.

A gate electrode 34p is formed on the silicon substrate 10 with a gate insulating film 32 interposed therebetween in the p-channel transistor region where the n-well 62 is formed in. A sidewall insulating film 48 is formed on the side walls of the gate electrode 34p. In the silicon substrate 10 on both sides of the gate electrode 34p, p-type source/drain regions 64 having the extension source/drain structure are formed. N-type pocket regions 40 are formed immediately below the extension regions of the p-type source/drain regions 64. The extension regions are the shallow regions of the p-type source/drain regions 64 immediately below the sidewall insulating film 48 and correspond to the p-type impurity diffused regions 44 which will be described later.

As shown in FIGS. 1 and 3, the n-well 62 includes an n-type impurity diffused region 26 having the impurity concentration peak immediately below the n-type pocket regions 46, an n-type impurity diffused region 28 having the impurity concentration peak near the bottom of the p-type source/drain diffused layer 62 and an n-type impurity diffused region 30 having the impurity concentration peak near the bottom of the device isolation film 12. The n-type impurity diffused region 26 is a diffused layer mainly for the threshold voltage control. The n-type impurity diffused region 28 is a diffused layer mainly for controlling the extension of the depletion layers from the source/drain regions 64 in the channel direction and, to this end, has a higher impurity concentration than the n-type impurity diffused region 26. The n-type impurity diffused region 30 is a diffused layer mainly for constituting the well and also functions to prevent punch-through and decrease the well resistance. The n-type impurity diffused region 30 is extended entirely in the device isolation region.

As described above, one characteristic of the semiconductor device according to the present embodiment is the impurity diffused region (the p-type impurity diffused region 20 or the n-type impurity diffused region 28) having the impurity concentration peaks near the bottom of the source/drain diffused regions, which is as the diffused layer for controlling the extension of the depletion layers in the channel direction. Another characteristic of the semiconductor device according to the present embodiment is that the peak of the impurity diffused region (the p-type impurity diffused region 18 or the n-type impurity diffused region 26) for controlling the threshold voltage is positioned deeper than the pocket region (the p-type pocket regions 40 or the n-type pocket regions 46).

Next, the reasons why the semiconductor device according to the present embodiment has the impurity profiles of the wells as described above will be explained.

The conventional general semiconductor device has the structure as exemplified in FIG. 4.

That is, a device isolation film 102 for defining a device region is formed in the primary surface of a silicon substrate 100. A well 104 is formed in the silicon substrate 100 in the device region. A gate electrode 108 is formed, on the silicon substrate 100 with the well 104 formed in, with a gate insulating film 106 interposed therebetween. A sidewall insulating film 110 is formed on the side walls of the gate electrode 108. Source/drain regions 112 having the extension source/drain structure are formed in the silicon substrate 100 on both sides of the gate electrode 108. Pocket regions 114 are formed immediately below the extension regions of the source/drain regions 112.

The well 104 has an impurity diffused region 116 having the impurity concentration peak shallower than the pocket regions 114, and an impurity diffused region having the impurity concentration peak near the bottom of the device isolation film 102. The impurity diffused region 116 is a diffused layer mainly for the threshold voltage control, and the impurity diffused region 118 is a diffused layer mainly for the punch-through stopper and decreasing the well resistance.

FIGS. 5A and 5B are graphs of the substrate bias dependency of the $I_d$-$V_g$ characteristics of the n-channel MOS transistor having the structure shown in FIG. 4. FIG. 5A is of the n-channel MOS transistor whose gate length $L_g$ is 60 nm, and FIG. 5B is of the n-channel MOS transistor whose gate length $L_g$ is 40 nm. The ○ marks indicate the case of a substrate bias $V_b$ of a 0 V, and the ● marks indicate the case of a substrate bias of a −2 V.

In the case of a 60 nm-gate length $L_g$, as shown in FIG. 5A, the substrate bias $V_b$ is increased in the minus direction, whereby the characteristic curve is shifted right. That is, the substrate bias $V_b$ is increased in the minus direction, whereby the threshold voltage $V_{th}$ can be increased.

However, when the gate length $L_g$ is as short as 40 nm, as shown in FIG. 5B, the characteristic curve is not substantially changed even when the substrate bias $V_b$ is increased in the minus direction. That is, it is difficult to control the threshold voltage $V_{th}$ by the substrate bias $V_b$.

The inventors of the present application made earnest studies of reasons why the gate length $L_g$ decrease makes the threshold voltage control by the substrate bias $V_b$ in the transistor of the structure shown in FIG. 4 difficult, and have found that the depletion layers extended from the source/drain junction block the influence of the substrate bias applied to the well.

FIGS. 6A and 6B are diagrammatic views of positions of the ends of the depletion layers when the threshold voltages $V_{th}$ is applied to the gate electrode. FIG. 6A shows the case of a 60 nm-gate length $L_g$, and FIG. 6B shows the case of a 40 nm-gate length $L_g$. The dotted lines indicate the ends of the depletion layers on the side of the silicon substrate, and the solid lines indicate the terminal ends of electric flux lines from the gate electrode. The areas of the regions below the gate electrode 108 enclosed by the dotted lines and the solid lines correspond to charge quantities in the channel region.

With the gate length $L_g$ of 60 nm, as shown in FIG. 6A, as the substrate bias $V_b$ is increased in the minus direction, the ends of the depletion layers on the side of the substrate gradually become deeper. The ends of the electric flux lines from the gate electrode range farther as the substrate bias $V_b$ is increased. This means that as the substrate bias $V_b$ increases, the charge quantity in the channel region is increased. Accordingly, the substrate bias $V_b$ is increased in the minus direction, whereby the threshold voltage can be increased.

With the gate length $L_g$ as short as 40 nm, however, as shown in FIG. 6B, the depletion layer extended from the source junction and the depletion layer extended from the drain junction are very near each other, with a result that even as the substrate bias $V_b$ goes on being increased, the ends of electric flux lines from the gate electrode substantially equally range, i.e., the charge quantity in the channel region is not substantially changed. Resultantly, the control of the threshold voltage $V_{th}$ by the substrate bias $V_b$ is difficult.

Then, the inventors of the present application have came up with the idea of newly forming an impurity diffused region for suppressing the extension of the depletion layers of the source/drain junctions in the channel direction (p-type impurity diffused region 20, n-type impurity diffused region 28) in order to prevent the influence of the depletion layer on the charge quantity in the channel region by closing the source region and the drain region to each other. Accordingly, forming such the impurity diffused region makes the control of the threshold voltage $V_{th}$ of the transistor having the shorter channel length by the substrate bias $V_b$ possible.

FIG. 7 is a diagrammatic view showing the positions of the ends of the depletion layers and the ranges of the terminal ends of electric flux lines form the gate electrode, with the threshold voltage $V_{th}$ applied to the gate electrode of the semiconductor device according to the present embodiment. In FIG. 7, the gate length $L_g$ is 40 nm.

As described above, the semiconductor device according to the present embodiment is characterized by the impurity diffused regions (the p-type impurity diffused region 20 or the n-type impurity diffused region 28) having the impurity concentration peaks near the bottom of the source/drain diffused regions. As a result, the extension of the depletion layers from the source junction and the drain junction in the channel direction is suppressed in comparison with the case of FIG. 6B. That is, in the semiconductor device according to the present embodiment, even with the transistor having a shorter channel length, the gate charge quantity can be increased as the substrate bias $V_b$ is increased. Thus, the substrate bias $V_b$ is increased in the minus direction, whereby the threshold voltage $V_{th}$ can be increased.

Here, the p-type impurity diffused region 20 and the n-type impurity diffused region 28 are formed in depths which are suitable to suppress the extension of the depletion layers from the source junction and from the drain junction. To this end it is preferable that the p-type impurity diffused region 20 and the n-type impurity diffused region 28 have the impurity concentration peaks near the bottom of the source/drain diffused regions.

It is also preferable that the p-type impurity diffused region 20 and the n-type impurity diffused region 28 are formed at positions which are deeper than the ends of the depletion layers on the side of the substrate with the substrate bias $V_b$ of 0 V (see FIG. 7). This is because the p-type impurity diffused region 20 and the n-type impurity diffused region 28 are provided to so that the threshold voltage $V_{th}$ is not changed when the substrate bias $V_b$ is 0 V.

The semiconductor device according to the present embodiment is also characterized in that the diffused layer for controlling the threshold voltage (the p-type impurity diffused region 18 and the n-type impurity diffused region 28) is formed at the deeper position than the pocket regions (the p-type pocket region 40 and the n-type pocket region 46).

In the usual transistor, as exemplified in FIG. 4, the impurity diffused region for the threshold voltage control is formed at the shallower region than the pocket regions 114. When the transistor is downsized with this impurity profiled retained, the impurity diffused region 116 for the threshold voltage control is formed in a very shallow region of the silicon substrate 100. However, when an impurity concentration near the surface of the silicon substrate 10, which is to be the channel, is increased, the scatter of carriers of the dopant ions is increased to thereby decrease the carrier mobility, which leads to degradation of the transistor characteristics.

In contrast to this, as in the semiconductor device according to the present embodiment, in downsizing the transistor, the extension regions and the pocket regions are made shallow, while the diffused layer for the threshold voltage control is formed at the deeper position than the pocket regions, whereby the impurity concentration of the side of the channel surface can be made lower in comparison with that of the semiconductor device shown in FIG. 4. Thus, the scatter of the carriers by the dopant ions can be decreased, and the carrier mobility can be accordingly increased.

Usually, the pocket layer is formed locally immediately below the heavily doped extension regions (an n-type impurity diffused regions 38 and a p-type impurity diffused regions 44 which will be described later), but the diffused layer for the threshold voltage control is formed also in the channel region. Thus, the diffused layer for the threshold voltage control is formed at a deeper position than the pocket regions, whereby the extension regions and the diffused layer for the threshold voltage control can be spaced from each other. The heavily doped extension regions and the diffused layer for the threshold voltage control can be kept from the direct contact with each other, whereby the leakage current taking place when a high voltage is applied to both layers, e.g., when a substrate bias is applied can be decreased.

It is preferable that the diffused layer for suppressing the extension of the depletion layers from the source/drain regions in the channel direction (the p-type impurity diffused region 20 and the n-type impurity diffused region 28) are formed with a dopant impurity having a larger mass and a smaller diffusion coefficient than a dopant impurity forming the diffused layer for the threshold voltage control (the p-type impurity diffused region 18 and the n-type impurity diffused region 26).

It is preferable that the diffused layer for the threshold voltage control (the p-type impurity diffused layer 18 and the n-type impurity diffused layer 26), which is formed in the relatively shallow region including the channel region), is doped with a light dopant impurity which little damage the silicon substrate by the ion implantation.

On the other hand, the diffused layer for controlling the extension of the depletion layers from the source/drain regions in the channel direction (the p-type impurity diffused region 20 and the n-type impurity diffused region 28), which are formed at relatively deep positions, is distributed to the channel region when distributed unnecessarily broad, resultantly causing the impurity concentration of the channel region to increase. Accordingly, it is preferable to use a dopant impurity which is not distributed broad immediately after the ion implantation and is diffused a little by a later thermal processing steps.

Specifically, it is preferable the p-type impurity diffused region 18 is formed of boron (B), and the p-type impurity diffused region 20 is formed of indium (In) or gallium (Ga). It is preferable that the n-type impurity diffused region is formed of phosphorus (P), and the n-type impurity diffused region 28 is formed of arsenic (As) or antimony (Sb).

FIGS. 8A and 8B are graphs of the substrate bias dependency of the $I_d$-$V_g$ characteristics of the semiconductor device according to the present embodiment. FIG. 8A is for an n-channel transistor of a 40 nm-gate length $L_g$, and FIG. 8B is for a p-channel transistor of a 40 nm-gate length $L_g$. The ○ marks indicate the case of a 0 V substrate $V_b$, and the ● marks indicate the case of a −2 V substrate bias $V_b$.

As shown in FIGS. 8A and 8B, the structure of the semiconductor device according to the present embodiment permitted both an n-channel transistor and a p-channel transistor of even a 40 nm-gate length $L_g$ to perform the control of the threshold voltage $V_{th}$ by the substrate bias $V_b$, which cannot be performed in the semiconductor device of the structure shown in FIG. 4.

Next, the method for fabricating the semiconductor device according to the present embodiment will be explained with reference to FIGS. 9A to 12B.

Figure 9A:
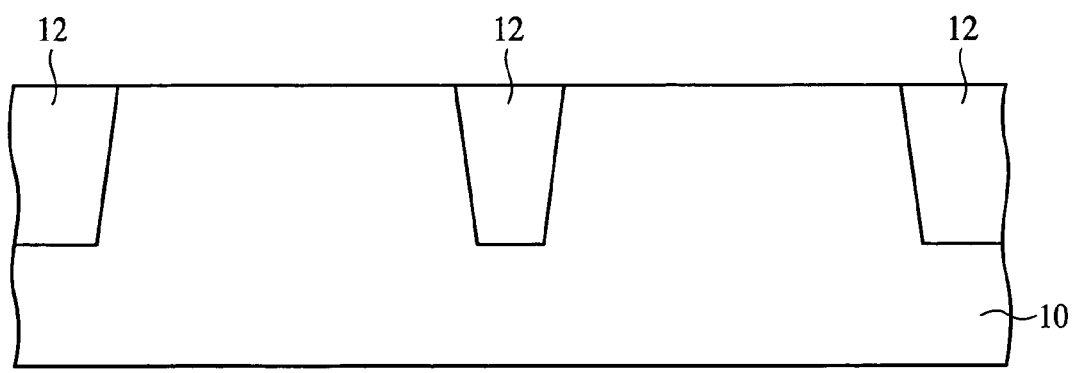
FIGS. 9A-9C, 10A-10C, 11A-11B and 12A-12B are sectional views of the semiconductor device according to the embodiment of the present invention in the steps of the method for fabricating the same, which show the method.

First, the device isolation film 12 is formed in the silicon substrate 10, buried in trenches of, e.g., a 300 nm-depth by, e.g., STI (Shallow Trench Isolation) method (FIG. 9A). In the drawings, the device region on the left side is a region for an n-channel transistor to be formed in, and the device region on the right side is a region for a p-channel transistor to be formed in.

Next, a sacrificial oxidation film 14 is formed by, e.g., thermal oxidation method on the device regions defined by the device isolation film 12.

Then, by photolithography, a photoresist film 16 exposing the region for the n-channel transistor to be formed in and covering the region for the p-channel transistor to be formed in is formed.

Figure 9B:
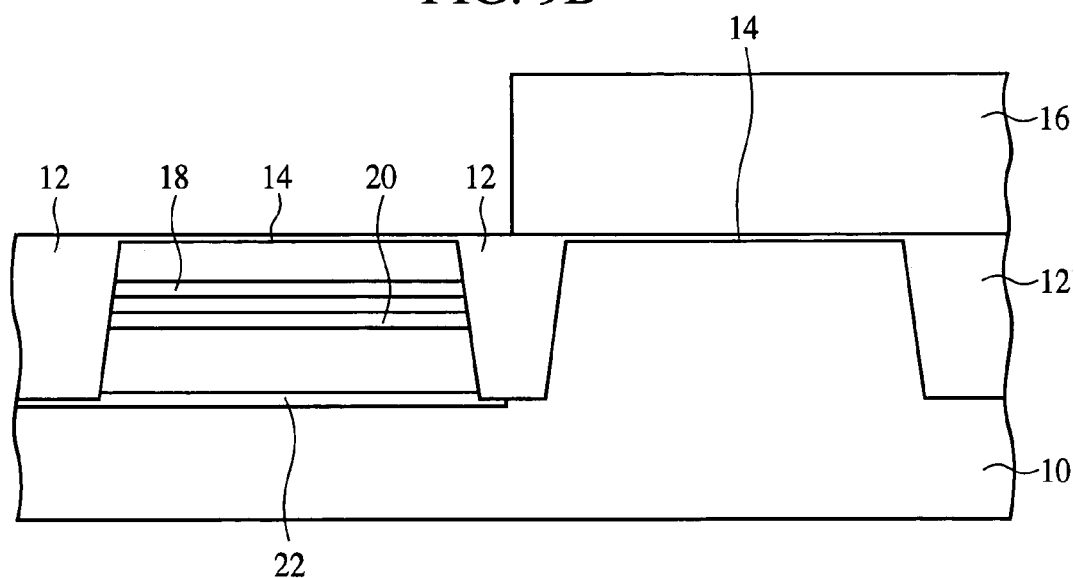

Then, with the photoresist film 16 as the mask, ion implantation is performed to from the p-type impurity diffused regions 18, 20, 22 in the silicon substrate 10 in the region for the n-channel transistor to be formed in (FIG. 9B). The p-type impurity diffused region 18 is formed by implanting, e.g., indium ions (In$^+$) at a 60 keV acceleration energy and a $1 \times 10^{13}$ cm$^{-2}$ dosage. The p-type impurity diffused region 20 is formed by implanting, e.g., indium ions at a 180 keV acceleration energy and a $3 \times 10^{13}$ cm$^{-2}$ dosage. The p-type impurity diffused region 22 is formed by implanting, e.g., boron ions (B$^+$) at a 150 keV acceleration energy and a $3 \times 10^{13}$ cm$^{-2}$ dosage.

Then, the photoresist film 16 is removed by, e.g., ashing.

Next, by photolithography, a photoresist film 24 exposing the region for the p-channel transistor to be formed in and covering the region for the n-channel transistor to be formed in is formed.

Figure 9C:
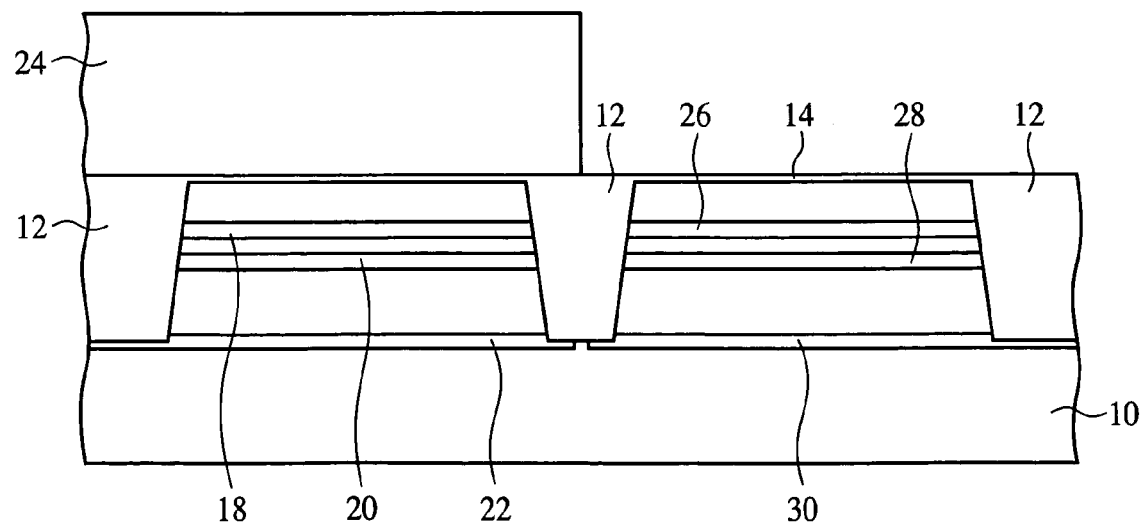

Next, with the photoresist film 24 as the mask, ion implantation is performed to form the n-type impurity diffused regions 26, 28, 30 in the silicon substrate 10 in the region for the p-channel transistor to be formed in (FIG. 9C). The n-type impurity diffused region 26 is formed by implanting, e.g., arsenic ions (As$^+$) at a 100 keV acceleration energy and a $5 \times 10^{12}$ cm$^{-2}$ dosage. The n-type impurity diffused region 28 is formed by implanting, e.g., arsenic ions at a 150 keV acceleration energy and a $3 \times 10^{12}$ cm$^{-2}$ dosage. The n-type impurity diffused region 30 is formed by implanting, e.g., phosphorus ions (P$^+$) at a 300 keV acceleration energy and a $3 \times 10^{13}$ cm$^{-2}$ dosage.

Next, the photoresist film 24 is removed by, e.g., ashing.

Then, the sacrificial oxidation film 14 is removed by wet etching using, e.g., a hydrofluoric acid-based aqueous solution.

Next, a silicon oxide film of, e.g., a 1 nm-thick is grown by, e.g., thermal oxidation on the device regions exposed by removing the sacrificial oxidation film 14 to form the gate insulating film 32 of the silicon oxide film.

Next, a polycrystalline silicon film of, e.g., a 100 nm-thick is deposited on the gate insulating film 32 by, e.g., CVD method.

Figure 10A:
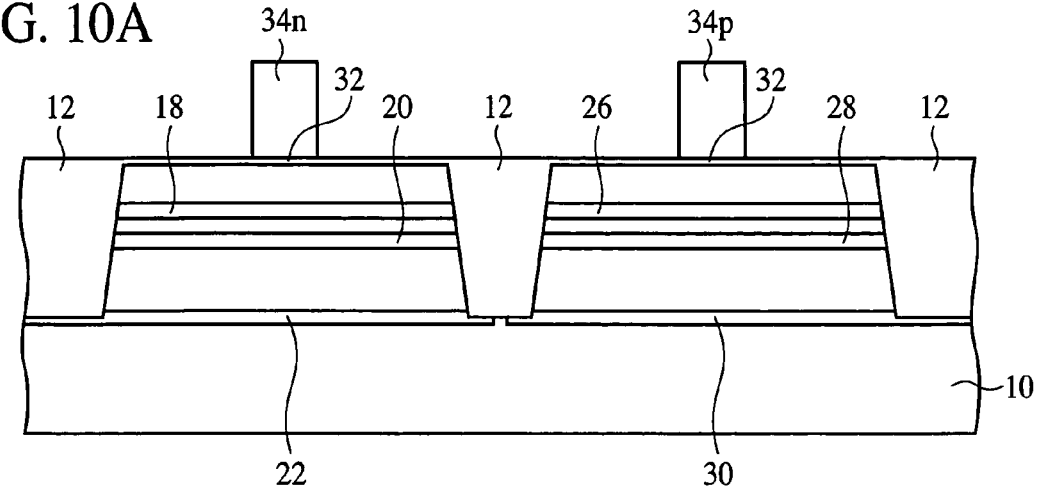

Next, the polycrystalline silicon film is patterned by photolithography and dry etching to form the gate electrodes 34$n$, 34$p$ of the polycrystalline silicon film (FIG. 10A). Here, the gate electrode 34$n$ is the gate electrode of the n-channel transistor, and the gate electrode 34$p$ is the gate electrode of the p-channel transistor.

Then, a photoresist film 36 exposing the region for the n-channel transistor to be formed in and covering the region for the p-channel transistor to be formed in is formed by photolithography.

Next, with the photoresist film 36 and the gate electrode 34$n$ as the mask, ion implantation is performed to form the n-type impurity diffused regions 38 to be the extension regions of the n-channel transistor in the silicon substrate 10 on both sides of the gate electrode 34$n$. The n-type impurity diffused regions 38 are formed by implanting, e.g., arsenic ions at a 2 keV acceleration energy and a $1 \times 10^{15}$ cm$^{-2}$ dosage.

Figure 10B:
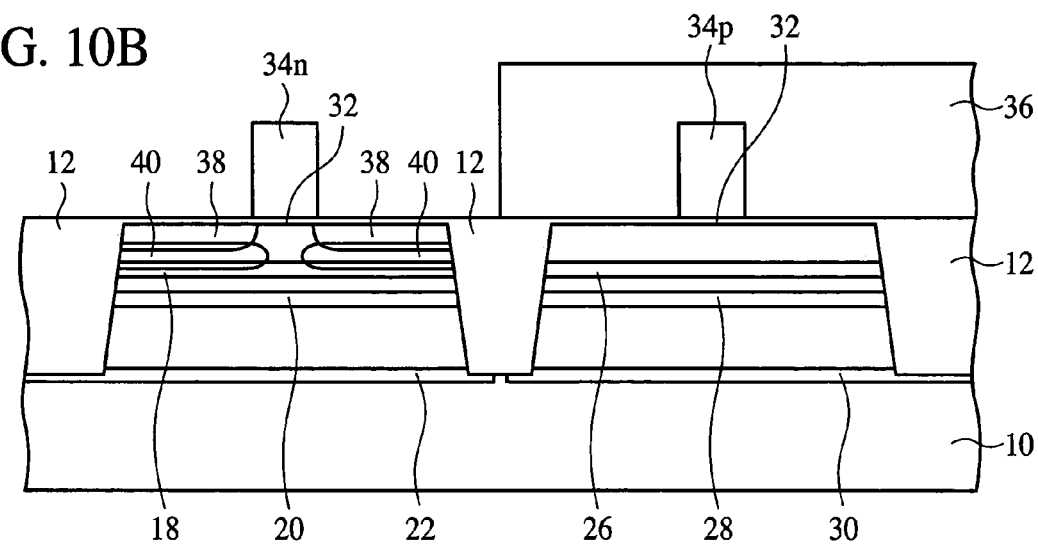

Then, with the photoresist film 36 and the gate electrode 34$n$ as the mask, ion implantation is performed to form the p-type pocket regions 40 in the region for the n-channel transistor to be formed in (FIG. 10B). The p-type pocket regions 40 are formed by implanting indium ions at a 25° tilt angle to the normal to the substrate, at a 50 keV acceleration energy and a $2 \times 10^{13}$ cm$^{-2}$ dosage.

Next, the photoresist film 36 is removed by, e.g., ashing.

Then, by photolithography, a photoresist film 42 exposing the region for the p-channel transistor to be formed in and covering the region for the n-channel transistor to be formed in is formed.

Then, with the photoresist film 42 and the gate electrode 34$p$ as the mask, boron ions, for example, are implanted at a 0.5 keV acceleration energy and a $1 \times 10^{15}$ cm$^{-2}$ dosage to form the p-type impurity diffused regions 44 to be the extension regions of the p-channel transistor.

Figure 10C:
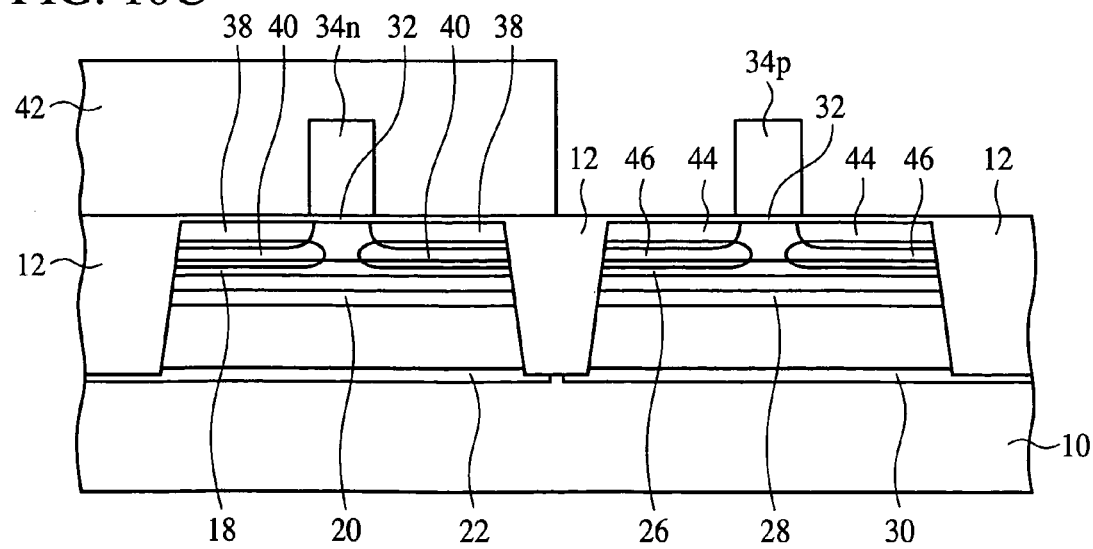

Then, with the photoresist film 42 and the gate electrode 34$p$ as the mask, ion implantation is performed to form the n-type pocket regions 46 in the region for the p-channel transistor to be formed in (FIG. 10C). The n-type pocket regions 46 are formed by implanting, e.g., arsenic ions at a 25° tilt angle to the normal to the substrate, at a 50 keV acceleration energy and a $2 \times 10^{13}$ cm$^{-2}$ dosage.

Then, the photoresist film 42 is removed by, e.g., ashing.

Figure 11A:
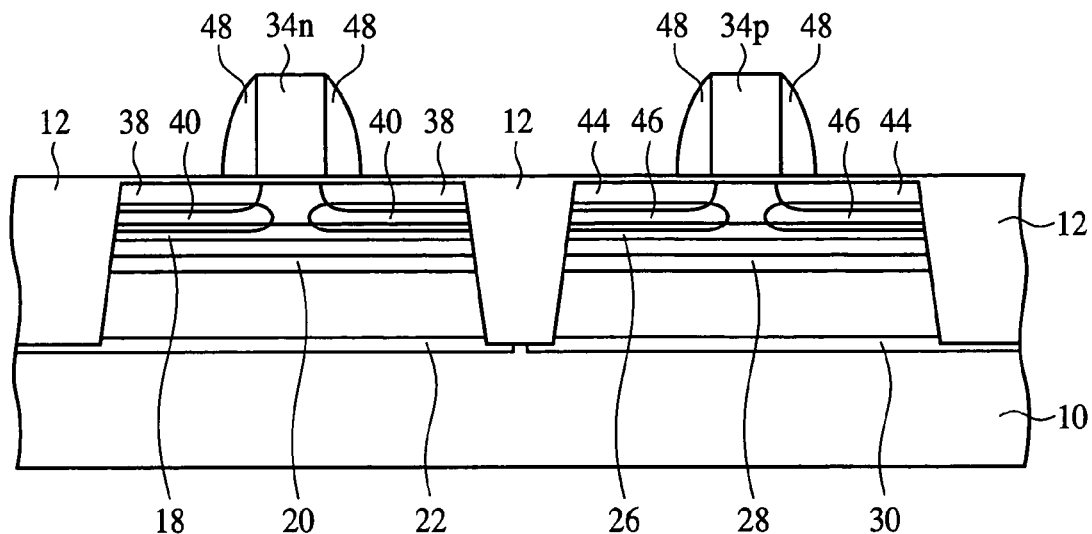

Next, a silicon oxide film of, e.g., a 100 nm-thick is deposited by, e.g., CVD method, and then the silicon oxide film is etched by dry etching to form the sidewall insulating film 48 on the side walls of the gate electrodes 34$n$, 34$p$ (FIG. 11A).

Then, by photolithography, a photoresist film 50 exposing the region for the n-channel transistor to be formed in and covering the region for the p-channel transistor to be formed in is formed.

Figure 11B:
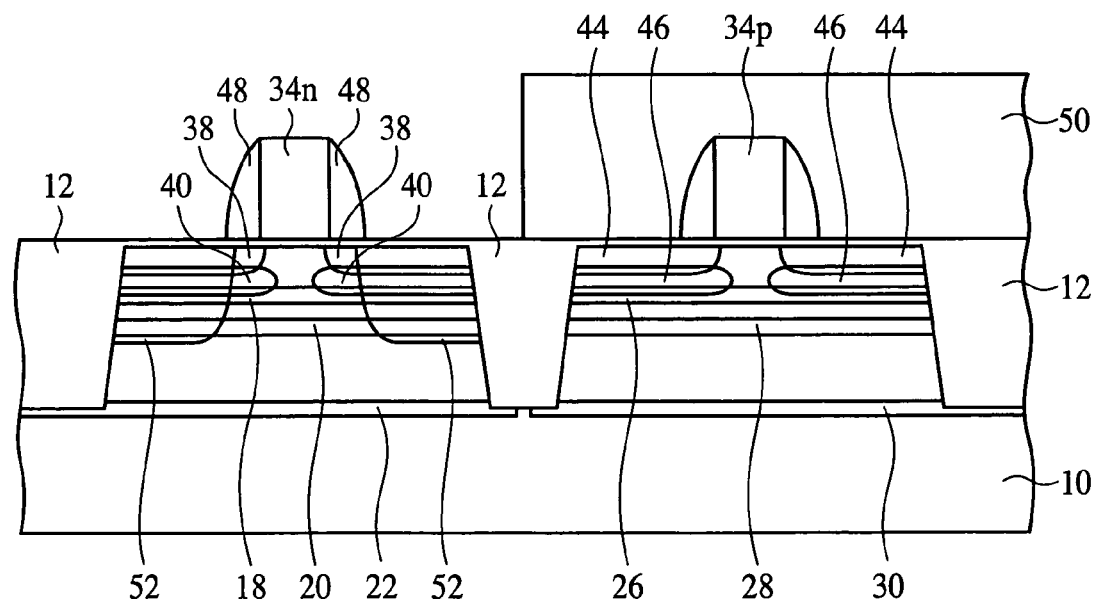

Then, with the photoresist film 50, the gate electrode 34$n$ and the sidewall insulating film 48 as the mask, ion implantation is performed to from the n-type impurity diffused regions 52 in the silicon substrate 10 on both sides of the gate electrode 34$n$ (FIG. 11B). The n-type impurity diffused regions 52 is formed by implanting, e.g., phosphorus ions at a 20 keV acceleration energy and a $5 \times 10^{15}$ cm$^{-2}$ dosage.

Then, the photoresist film 50 is removed by, e.g., ashing.

Next, by photolithography, a photoresist film 54 exposing the region for the p-channel transistor to be formed in and covering the region for the n-channel transistor to be formed in is formed.

Figure 12A:
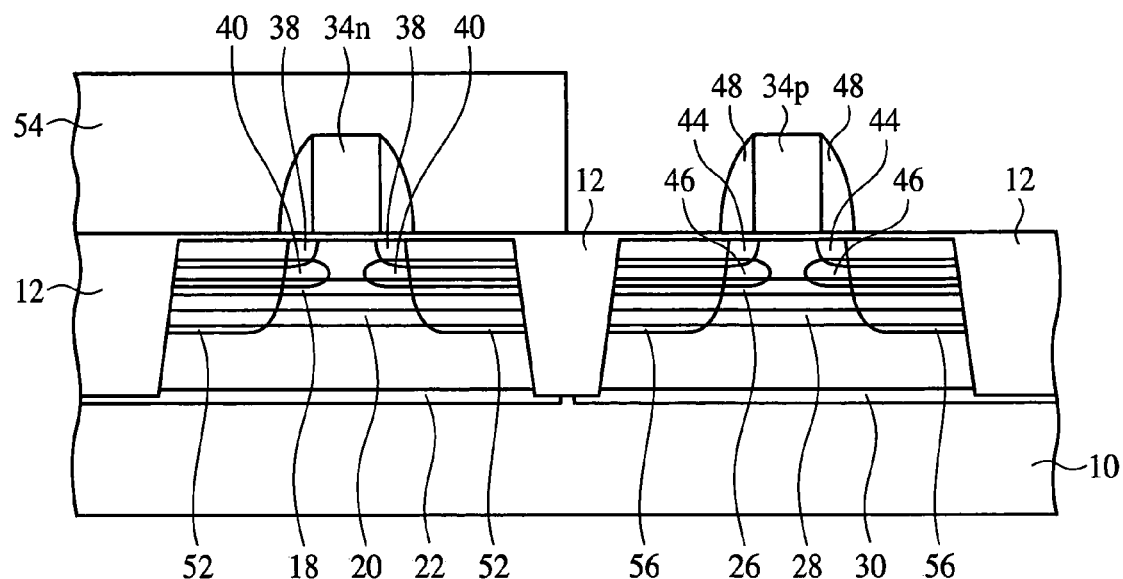

Next, with the photoresist film 54, the gate electrode 34$p$ and the sidewall insulating film 48 as the mask, ion implantation is performed to form the p-type impurity diffused regions 56 in the silicon substrate 10 on both sides of the gate electrode 34$p$ (FIG. 12A). The p-type impurity diffused regions 56 are formed by implanting, e.g., boron ions at a 5 keV acceleration energy and a $5 \times 10^{15}$ cm$^{-2}$ dosage.

Then, the photoresist film 54 is removed by, e.g., ashing.

Figure 12B:
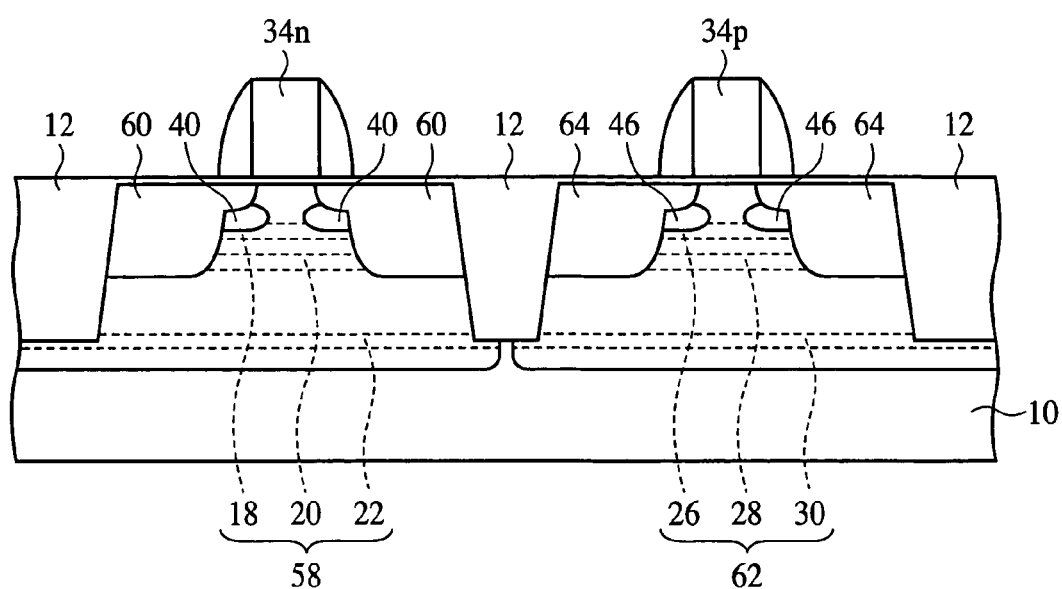

Then, rapid thermal processing of 3 seconds is performed at, e.g., 1000° C. to activate the implanted impurities. Thus, in the region for the n-channel transistor formed in, the p-well 58 including the p-type impurity diffused regions 18, 20, 22, and the n-type source/drain regions 60 of the extension source/drain structure including the n-type impurity diffused regions 38, 52 are formed. In the region for the p-channel transistor to be formed in, the n-well 62 including the n-type impurity diffused regions 26, 28, 30, and the p-type source/drain regions 64 of the extension source/drain structure including the p-type impurity diffused regions 44, 56 are formed (FIG. 12B).

As described above, according to the present embodiment, the well including the impurity diffused region having impurity concentration peak near the bottom of the source/drain regions, whereby the extension of the depletion layers from the source junction and the drain junction can be suppressed. Accordingly, even in a transistor having a very short channel length of a gate length of below 60 nm, the gate charge quantity can be increased with the substrate bias increases, and the threshold voltage can be controlled by the substrate bias.

The well including the impurity diffused region having the impurity concentration peak at a region deeper than the pocket region is formed to thereby control the threshold voltage of the transistor by the impurity diffused regions, whereby the impurity concentration on the side of the channel surface can be decreased in comparison with the case in which the impurity diffused region for the threshold voltage control is formed at the region shallower than the pocket regions. Thus, the scatter of the carriers by the dopant ions is decreased, and the carrier mobility can be increased.

In a semiconductor device combining, e.g., a logic device and a memory device, the MIS transistor according to the present embodiment is applicable to the logic transistors, which required low voltage and high operational speed. In a semiconductor device including low-voltage operative transistors (e.g., logic transistors, etc.) and high-voltage operative transistors (e.g., I/O transistors, etc.), the MIS transistor according to the present embodiment is applicable to the low-voltage operative transistors.

As exemplified in FIG. 13, the n-channel transistor according to the present embodiment (on the left side of the drawing) formed in the p-well 58 including the p-type impurity diffused region 18 having the impurity concentration peak immediately below the p-type pocket regions 40, the p-type impurity diffused region 20 having the impurity concentration peak near the bottom of the n-type source/drain diffused layers 60 and the p-type impurity diffused region 22 having the impurity concentration peak near the bottom of the device isolation film 12, and the n-channel transistor (on the right side of the drawing) formed in the p-well 70 including the p-type impurity diffused region 66 for the threshold voltage control having the impurity concentration peak at the region shallower than the p-type pocket regions 40 and the p-type impurity diffused region 68 having the impurity concentration peak near the bottom of the device isolation film 12 are formed on the same silicon substrate 10.

Figure 13:
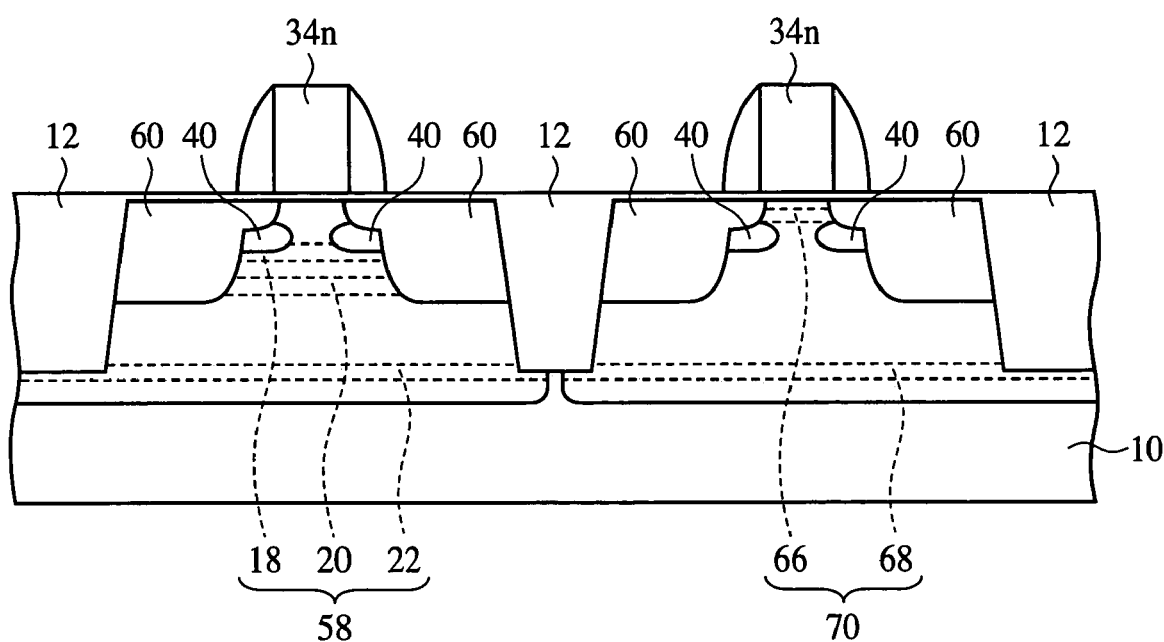
FIG. 13 is a diagrammatic sectional view of an example of the applications of the semiconductor device according to the embodiment of the present invention.

Transistors to be combined with the MIS transistor according to the present embodiment are not limited to the transistors of the structure shown in FIG. 13.

Modified Embodiments

The present invention is not limited to the above-described embodiment and can cover other various modifications.

For example, in the above-described embodiment, the present invention is applied to the n-channel transistor and the p-channel transistor. However, the present invention may be applied to either of the n-channel transistor and the p-channel transistor.

In the above-described embodiment, the wells each include the impurity diffused regions having 3 impurity concentration peaks but may have 4 or more impurity concentration peaks. For example, additional impurity diffused regions may be formed respectively between the impurity diffused regions 20, 28 and the impurity diffused regions 22, 30. The wells may be double wells.

In the above-described embodiment, the pocket regions are formed respectively on the side of the source region and on the side of the drain region. However, the pocket regions may be formed on the side of either (e.g., the drain region) of the source region and the drain region.

What is claimed is:

1. A semiconductor device comprising:
a well of a first conductivity type formed in a semiconductor substrate and having a channel region;
a gate electrode formed over the channel region with an insulating film interposed therebetween;
source/drain regions of a second conductivity type formed in the well on both sides of the gate electrode, sandwiching the channel region; and
a pocket region of the first conductivity type formed between at least one of the source/drain regions and the channel region,
the well having a first peak of an impurity concentration of first impurities of the first conductivity type at a first depth deeper than the pocket region and shallower than the bottom of the source/drain regions, and a second peak of the impurity concentration of second impurities of the first conductivity type at a second depth near the bottom of the source/drain regions.

2. A semiconductor device according to claim 1, wherein each of the source/drain regions includes a first impurity diffused region formed in alignment with the gate electrode, and a second impurity diffused region formed in alignment with a sidewall insulating film formed on the side wall of the gate electrode and being deeper than the first impurity diffused region, and
the pocket region is formed immediately below the first impurity diffused region.

3. A semiconductor device according to claim 1, wherein the impurity concentration of the well at the second peak is higher than the impurity concentration of the well at the first peak.

4. A semiconductor device according to claim 1, wherein the well has a third peak of the impurity concentration of third impurities of the first conductivity type at a third depth deeper than the source/drain regions.

5. A semiconductor device according to claim 4, wherein the third peak is extended all over in the device isolation region.

6. A semiconductor device according to claim 1, wherein the first impurity forming the first peak is mainly boron, and
the second impurity forming the second peak is mainly indium or gallium.

7. A semiconductor device according to claim 1, wherein the first impurity forming the first peak is mainly phosphorus, and
the second impurity forming the second peak is mainly arsenic or antimony.

8. A semiconductor device according to claim 1, wherein a gate length of the gate electrode is less than 60 nm.

9. A semiconductor device including a logic unit and a memory unit, comprising:
a well of a first conductivity type formed in a semiconductor substrate of the logic unit and having a channel region; and
a logic transistor including a gate electrode formed over the channel region with an insulating film interposed therebetween, source/drain regions of a second conductivity type formed in the well on both sides of the gate electrode, sandwiching the channel region, and a pocket region of the first conductivity type formed between at least one of the source/drain regions and the channel region,
the well having a first peak of an impurity concentration of first impurities of the first conductivity type at a first depth deeper than the pocket region and shallower than the bottom of the source/drain regions, and a second peak of the impurity concentration of second impurities of the first conductivity type at a second depth near the bottom of the source/drain regions.

10. A semiconductor device including a low-voltage transistor region and a high-voltage transistor region, comprising:
a well of a first conductivity type formed in a semiconductor substrate of the low-voltage transistor region and having a channel region; and a low-voltage transistor including a gate electrode formed over the channel region with an insulating film interposed therebetween, source/drain regions of a second conductivity type formed in the well on both sides of the gate electrode, sandwiching the channel region, and a pocket region of the first conductivity type formed between at least one of the source/drain regions and the channel region, the well having a first peak of an impurity concentration of first impurities of the first conductivity type at a first depth deeper than the pocket region and shallower than the bottom of the source/drain regions, and a second peak of the impurity concentration of second impurities of the first conductivity type at a second depth near the bottom of the source/drain regions.

11. A method for fabricating a semiconductor device, including a well of a first conductivity type formed in a semiconductor substrate and having a channel region, a gate electrode formed over the channel region with an insulating film interposed therebetween, source/drain regions of a second conductivity type formed in the well on both sides of the gate electrode, sandwiching the channel region, and a pocket region of the first conductivity type formed between at least one of the source/drain regions and the channel region, the step of forming the well comprising the steps of:

forming a first impurity diffused region having a first peak of an impurity concentration of first impurities of the first conductivity type at a first depth deeper than the pocket region and shallower than the bottom of the source/drain regions; and forming a second impurity diffused region having a second peak of the impurity concentration of second impurities of the first conductivity type at a second depth near the bottom of the source/drain regions.

12. A method for fabricating a semiconductor device according to claim 11, wherein
the step of forming the source/drain regions comprises the steps of:
implanting an impurity of the second conductivity type with the gate electrode as a mask to form a third impurity diffused region of the second conductivity type in the well at a depth shallower than the pocket region; and
implanting an impurity of the second conductivity type with the gate electrode and a sidewall insulating film formed on a side wall of the gate electrode as a mask to form a fourth impurity diffused region of the second conductivity type having a bottom positioned near the second peak.

13. A semiconductor device according to claim 1, wherein
the first peak is uniformly formed at the first depth uniformly throughout a region where the well is formed, and
the second peak is uniformly formed at the second depth throughout the region where the well is formed.

14. A semiconductor device according to claim 9, wherein
the first peak is uniformly formed at the first depth throughout a region where the well is formed, and
the second peak is uniformly formed at the second depth throughout the region where the well is formed.

15. A semiconductor device according to claim 10, wherein
the first peak is uniformly formed at the first depth throughout a region where the well is formed, and
the second peak is uniformly formed at the second depth throughout the region where the well is formed.

16. A method for fabricating a semiconductor device according to claim 11, further comprising:
forming the gate electrode after forming the well having the first peak and the second peak.

* * * * *

UNITED STATES PATENT AND TRADEMARK OFFICE
CERTIFICATE OF CORRECTION

PATENT NO. : 7,592,241 B2  Page 1 of 1
APPLICATION NO. : 11/017859
DATED : September 22, 2009
INVENTOR(S) : Yoshihiro Takao It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 433 days.

Signed and Sealed this

Twenty-first Day of September, 2010

David J. Kappos
*Director of the United States Patent and Trademark Office*